United States Patent
Guenther

(10) Patent No.: US 7,057,337 B1
(45) Date of Patent: *Jun. 6, 2006

(54) PATTERNING OF ELECTRODES IN OLED DEVICES

(75) Inventor: Ewald Karl Michael Guenther, Regenstauf (DE)

(73) Assignee: Osram Opto Semiconductors GmbH, Regensberg (DE)

( * ) Notice: Subject to any disclaimer, the term of this patent is extended or adjusted under 35 U.S.C. 154(b) by 185 days.

This patent is subject to a terminal disclaimer.

(21) Appl. No.: 10/363,200

(22) PCT Filed: Sep. 6, 2000

(86) PCT No.: PCT/SG00/00134

§ 371 (c)(1),
(2), (4) Date: Jul. 16, 2003

(87) PCT Pub. No.: WO02/21883

PCT Pub. Date: Mar. 14, 2002

(51) Int. Cl.
*H05B 33/14* (2006.01)
*H05B 33/10* (2006.01)

(52) U.S. Cl. ............... 313/503; 313/504; 313/506; 445/24; 445/25; 247/66; 428/690

(58) Field of Classification Search ........ 313/502–504, 313/506, 509, 511, 512
See application file for complete search history.

(56) References Cited

U.S. PATENT DOCUMENTS

| | | | | |
|---|---|---|---|---|
| 5,399,502 A | * | 3/1995 | Friend et al. | 438/22 |
| 5,701,055 A | * | 12/1997 | Nagayama et al. | 313/504 |
| 6,111,356 A | | 8/2000 | Roitman et al. | |
| 6,306,559 B1 | * | 10/2001 | Tanamura et al. | 313/504 |
| 6,582,888 B1 | * | 6/2003 | Herbst et al. | 313/504 |
| 6,699,728 B1 | * | 3/2004 | Guenther et al. | 438/39 |
| 6,784,009 B1 | * | 8/2004 | Lim et al. | 438/39 |
| 2004/0104385 A1 | | 6/2004 | Lim et al. | |

FOREIGN PATENT DOCUMENTS

| | | |
|---|---|---|
| DE | 19918193 | 11/1999 |
| EP | 0762806 | 3/1997 |
| JP | 11-283752 | 10/1999 |
| WO | WO 99/16039 | 4/1999 |

* cited by examiner

*Primary Examiner*—Mariceli Santiago
(74) *Attorney, Agent, or Firm*—Fish & Richardson P.C.

(57) ABSTRACT

An OLED device having pillars with cross section that is wider on the top. The pillars structure a conductive layer during deposition into distinct portions located between the pillars and on the top of the pillars. The pillars are formed by patterning a single photosensitive material which is inert to the chemicals used to deposit the organic functional layers of the OLED device. By using such pillars, the electrodes can be formed without damaging organic functional layers while achieving high resolution.

72 Claims, 5 Drawing Sheets

PATTERNING OF ELECTRODES IN OLED DEVICES

This application is a national stage entry under 35 U.S.C. 371 of PCT/SG00/00134, filed on Sep. 6, 2000.

FIELD OF THE INVENTION

The present invention relates to organic light emitting diode (OLED) devices. More particularly, the invention relates to the patterning of a conductive layer to form, for example, cathodes in OLED devices.

BACKGROUND OF THE INVENTION

FIG. 1 shows a conventional pixelated OLED device 100. Pixelated OLED devices can be used as displays in various consumer electronic products, including cellular phones, cellular smart phones, personal organizers, pagers, advertising panels, touch screen displays, teleconferencing and multimedia products, virtual reality products, and display kiosks.

Typically, the OLED device comprises a functional stack of one or more organic functional layers 110 between a transparent conductive layer 105 and a conductive layer 115. The functional stack is formed on a transparent substrate 101. The conductive layers are patterned to form rows of cathodes in a first direction and columns of anodes in a second direction. OLED pixels are located where the cathodes and anodes overlap. Bond pads 150 are coupled to the cathodes and anodes to control the OLED pixels. A cap 160, which forms a cavity 145 between it and the pixels, encapsulates the device to protect the OLED pixels from the environment such as moisture and/or air.

In operation, charge carriers are injected through the cathodes and anodes for recombination in the functional layers. The recombination of the charge carriers causes the functional layer of the pixels to emit visible radiation.

To provide a display with high resolution and high filling factor, the spacing between pixels should be small, for example, about less than 50 um. The spacing between the pixels is defined by the patterning processes that form the cathodes and anodes. Various conventional patterning techniques have been used to form the cathodes, such as shadow masking, photolithography (with wet or dry etching), laser ablation, or lift-off techniques (wet or dry resists). However, conventional patterning techniques are not fully compatible or feasible for fabricating OLEDs. For example, photolithographic techniques employ chemicals which damage the organic functional layers or cathode materials. With shadow masking or lift-off techniques (wet resists as well as dry resist foils), high resolutions (e.g., less than 50 um) are difficult to achieve, particularly in a manufacturing or production environment.

As evidenced from the above discussion, it is desirable to provide a patterning technique to pattern a conductive layer which achieves high resolutions without damaging already deposited materials.

SUMMARY OF THE INVENTION

The invention relates generally to the fabrication of devices such as OLED devices. More particularly, the invention relates to the patterning of a conductive layer. In one embodiment, pillars with an undercut (e.g., cross-section which is wider on top) are provided. In one embodiment, the pillars comprise a tapered profile. The pillars are formed by photolithography. In one embodiment, the pillars are formed from a photosensitive material. The pillars are inert to the solvents used to deposit the functional organic layers. The tapered profile of the pillars patterns a conductive layer into distinct first and second portions during deposition. The first portions are located between the pillars and the second portions are located on the top of the pillars. In one embodiment, the first portions serve as cathodes of an OLED device.

PREFERRED EMBODIMENTS OF THE INVENTION

Figure 1:
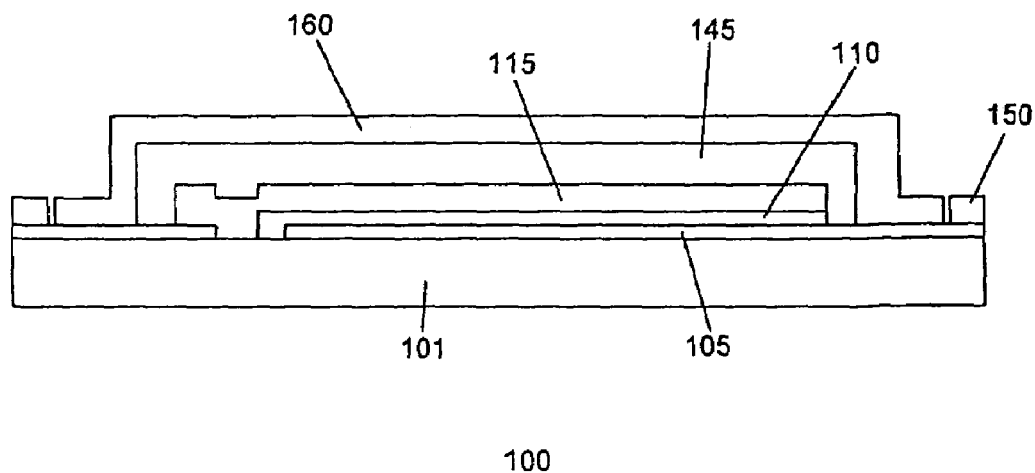
FIG. 1 shows a conventional OLED device.
Figure 2:
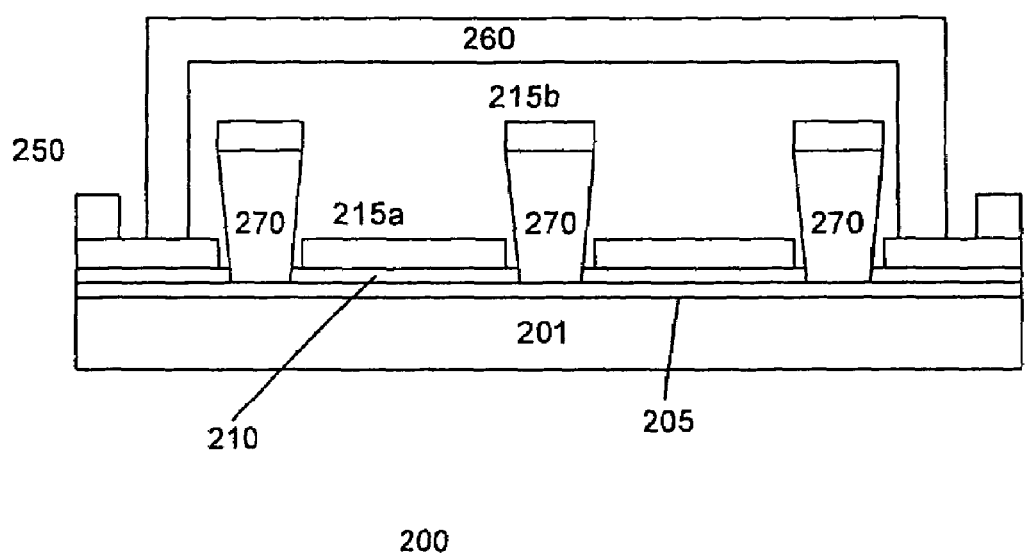
FIG. 2 shows an embodiment of the invention.

FIG. 2 shows an OLED device 200 in accordance with one embodiment of the invention. The OLED device comprises a substrate 201 on which pixels are formed. In one embodiment, the substrate comprises a transparent substrate, such as glass. Other types of transparent materials that can serve as a substrate to support the OLED pixels are also useful. The OLED pixels comprise one or more organic layers 210 sandwiched between first and second electrodes 205 and 215. In one embodiment, the first electrodes 205 are anodes and the second electrodes 215 are cathodes. Forming first-electrodes that are cathodes and second electrodes that are anodes is also useful. The cathodes and anodes are formed as strips in respective first and second directions. Typically, the first and second directions are orthogonal to each other. Bond pads 250 are electrically coupled to the cathodes and anodes. A cap 260 is provided to encapsulate the OLED pixels. The cap creates a cavity 245 to protect the pixels from being damaged by physical contact with the cap.

Pillars 270 are provided on the substrate surface. The pillars are arranged in a second direction. The height of the pillars extend above the functional stack (e.g., 1–10 um), separating the cathodes and the organic functional layers into strips. In an alternative embodiment, the pillars can also extend the height of the cavity to serve as support structures for the cap 260. This is particularly useful for flexible OLED devices since the cap is prevented from contacting and damaging the pixels.

In accordance with the invention, the pillars include an undercut, which results in structures which are wider at the top than at the bottom. The undercut serves to pattern a conductive layer 215 during deposition to form distinct or separate portions 215a above the functional layers and portions 215b on the top of the pillars. The portions 215a serve as cathodes. In one embodiment, the undercut is provided by forming pillars with a tapered profile. In one embodiment, the first and second sidewalls are tapered, producing pillars with a v-shaped cross-section.

In one embodiment, the pillars are formed from a single device layer. Forming the pillars from a single layer advantageously reduces manufacturing cost. Since the chemicals, such as solvents for depositing the functional organic layer or layers can be corrosive, the pillars are formed from a material that maintains its integrity during processing. In one embodiment, the pillars are formed using a photosensitive material such as resist. The resist is treated to render it inert to solvents. Other types of photosensitive materials, such as photosensitive polyimide or photosensitive polybenzosazole, are also useful. In addition, electron cure resist system, such as those manufactured by Allied Signal, can also be used to form pillars having the desired cross-sectional shape.

Figure 3:
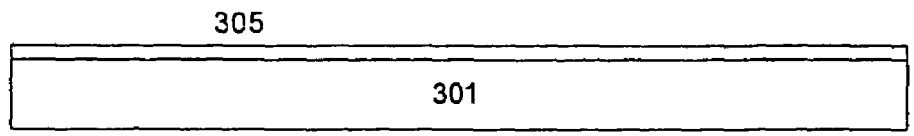
FIGS. 3–7 show a process for fabricating an OLED device in accordance with one embodiment of the invention.

FIGS. 3–7 show a process for fabricating an OLED device in accordance with one embodiment of the invention. Referring to FIG. 3, a substrate 301 is provided. In one embodiment, the substrate comprises a transparent substrate, for example, soda lime or borosilicate glass. Other types of transparent materials can also be used to serve as the substrate. The substrate typically is about 0.4–1.1 mm thick.

In another embodiment, the substrate comprises a thin flexible substrate. Thin flexible substrates are formed from, for example, plastic films such as transparent poly(ethylene terephthalate) (PET), poly(butylene terephthalate) (PBT), poly(enthylene naphthalate) (PEN), polycarbonate (PC), polyimides (PI), polysulfones (PSO), and poly(p-phenylene ether sulfone) (PES). Other materials such as polyethylene (PE), polypropylene (PP), poly(vinyl chloride) (PVC), polystyrene (PS) and poly(methyl methyleacrylate) (PMMA), can also be used to form the substrate. Alternatively, materials such as ultra thin glass (e.g., thickness between 10–100 um), a composite stack comprising glass and polymer or polymer films coated with inorganic barrier layers can also be used.

The substrate includes first electrodes 305 formed on the surface thereof. The first electrodes serve as, for example, anodes. The anodes are formed from a conductive material. In one embodiment, the conductive material comprises a transparent conductive material such as indium-tin-oxide (ITO). Other transparent conductive materials, for example, indium-zinc-oxide, zinc-oxide, tin-oxide, are also useful. In one embodiment, the anodes are arranged in strips in a first direction, each being separated by a space. Preferably, the space separating the anodes is less than 50 um wide. Connections to bond pads can also be provided. Various techniques, such as photolithography, can be used to form the anodes.

Figure 4:
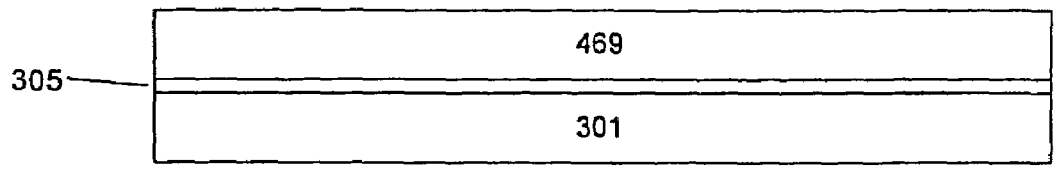

Referring to FIG. 4, a device layer 469 is deposited on the substrate. The device layer is used to create the pillars which facilitate patterning of a conductive layer to form the second electrodes (e.g., cathodes). The thickness of the device layer is equal to the height of the pillars. The thickness of the device layer, for example, is about 0.5–50 um, preferably about 1–10 um.

In one embodiment, the device layer comprises a negative acting photoresist such as AZ 5214E manufactured by Clariant. Other photosensitive materials can also be used. The resist is deposited on the substrate by, for example, spin-coating. In one embodiment, the resist is deposited by spinning the substrate at 1000 rpm for about 20 seconds using a Karl Suess RC 8 spin-coater. After depositing the resist, the substrate is baked at, for example, 90° C. for about 2 minutes to remove the resist solvent.

Figure 5:
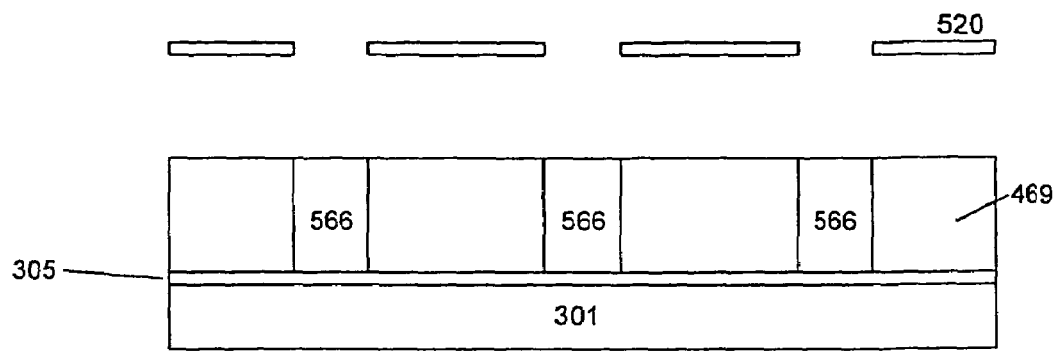

In FIG. 5, the device layer is selectively exposed to light from an exposure source through a mask 520. The exposure process is designed to form pillars with the desired undercut or tapered profile. The exposure process comprises, for example, successively exposing the photosensitive layer with electrons or charged particles having different energies which have different penetration depths to form the tapered profile during development. For a negative photosensitive layer, the exposure comprises selectively exposing the upper regions of the device layer with a lesser amount of energy than the lower regions. For a positive photosensitive layer, the exposure comprises selectively exposing the upper regions of the device layer with a greater amount of energy than the lower regions.

In one embodiment, a negative resist layer is selectively exposed with an exposure source. The exposure results in the upper portions of regions 566 absorbing a greater amount of light then the lower portions (i.e., underexposing the lower portions of regions 566). Regions 566 correspond to locations where pillars are to be formed. In one embodiment, the resist is exposed with I line radiation using a Karl Suess MJB 3 exposure source. The exposure dose is about 50 mJ/cm$^2$.

The resist is then prepared for development to remove the unexposed portions. The preparation, for a negative acting resist, includes a post-exposure bake to cross-link the resist in the exposed regions. The post-exposure bake is performed at, for example, about 120° C. for about 60–90 seconds. Cross-linking renders the resist insoluble to the resist development chemistry. After the post-exposure bake, the resist is subjected to a flood exposure from the exposure source (e.g. exposure without mask). The flood exposure renders the previously un-exposed portions of the resist soluble. The dose of the flood exposure is, for example, about 1000 mJ/cm$^2$.

Figure 6:
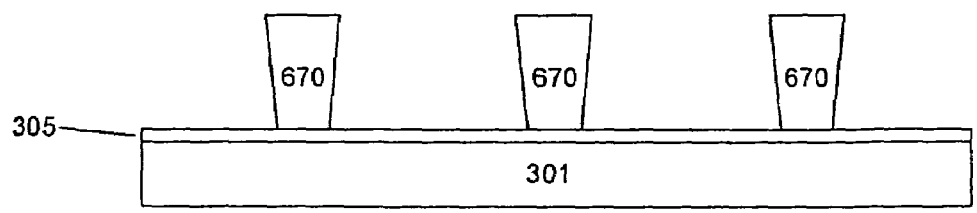

Referring to FIG. 6, the device layer is developed with a resist development chemistry to remove the unexposed regions, leaving pillars 670. In one embodiment, the resist chemistry comprises an alkaline developer such as A2 726 manufactured by Clariant. The resist is developed in the development chemistry at room temperature for about 60 seconds. Because the lower parts of the exposed regions were underexposed, they are more soluble to the resist chemistry. This creates pillars with an undercut, resulting in a cross-section that is narrower at the bottom than the top. The resist is then rinsed with de-ionized water to remove the developer.

After forming the pillars, the resist is cured to improve the mechanical stability of the pillars and to render pillars inert to the organic solvents used to form the functional organic layers. In one embodiment, the resist is cured by heating the substrate at a temperature of about 160° C. for about 6 hours. In one embodiment, the substrate is cured in accordance with the following parameters:

a) linear ramp from 100° C. to 160° C. in 2 hours;
b) constant curing at 160° C. for 4 hours; and
c) cool down without active cooling.

Other curing techniques such as electrom beam (e-beam), particle (proton, alpha) or UV curing can also be used. After curing, the substrate is cleared by subjecting it to UV-0$_3$ for about 3 minutes, removing small organic residues on the exposed portions of the substrate.

Figure 7:
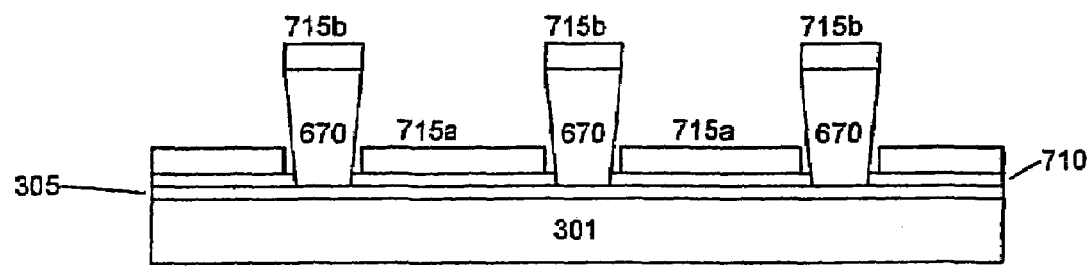

Referring to FIG. 7, a functional organic layer is deposited on the substrate. In one embodiment, the functional organic layer comprises a conjugated polymer. The polymer is dissolved in a solvent and deposited by spin-coating techniques. In one embodiment, the organic functional layer comprises a 1% solution of electroluminescent polymer dissolved in xylene deposited by spinning the substrate at 4000 rpm for about 30 seconds. Other wet deposition techniques are also useful. Such techniques, for example, include printing techniques (e.g., screen printing, off-set printing, ink-jet printing) in which the organic functional layer is dissolved in a solvent (e.g., NMP, or hexene). Depositing the organic functional layer by a wet process is advantageous as it is substantially self planarizing, resulting in the layer filling the area between the pillars with a substantially planar surface. The pillars, due to curing, are not adversely affected by the solvents. Additional functional layers can be deposited to form a functional organic stack. The thickness of the organic layer or stack is typically about 2–200 nm. After depositing the functional organic layer, the substrate is heated to a temperature of about 85° C. for about 1 minute to evaporate the solvent.

Portions of the organic layer can be selectively removed, for example, to expose underlying layers in regions 470 for bond pad connections. Selective removal of the organic layers can be achieved by a polishing process. Other techniques, such as etching, scratching, or laser ablation, can also be used to selectively remove portions of the organic layers.

A conductive layer 715 is deposited on the substrate. The conductive layer comprises, for example, Ca, Mg, Ba, Ag, Al or a mixture or alloy thereof. Other conductive materials, particularly those comprising a low work function, can also be used to form the second conductive layer. In one embodiment, the second conductive layer comprises Ca. The Ca is deposited by thermal evaporation at a rate of 1 nm/s and a pressure of about $10^{-5}$ mbar. Other deposition techniques, such as sputtering (PVD), chemical vapor deposition (CVD), plasma enhanced chemical vapor deposition (PECVD) or metal organic chemical vapor deposition (MOCVD), are also useful.

The deposition of the conductive layer is interrupted due to the height and profile of the pillars, resulting in parts 715*a* of the conductive layer being deposited in regions between the pillars and parts 715*b* of the conductive layer being formed on the top surface of the pillars. The parts of the conductive layer between the pillars serve as cathodes. The intersections of the cathodes and anodes form organic LED pixels.

The process continues to complete the OLED device. For example, a cavity cap is mounted on the substrate to encapsulate the device and bond pads are formed to provide electrical access to the OLED pixels.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

The invention claimed is:

1. A method for forming an OLED device comprising:
   fanning a device layer on a substrate;
   patterning the device layer to form pillars, wherein the pillars comprise a tapered profile;
   coating the substrate with a solution comprising an organic functional material dissolved in a solvent the pillars being inert to the solvent;
   removing the solvent to form an organic functional layer; and
   depositing a conductive layer on the substrate, wherein the pillars separate the conductive layer into first and second portions.

2. The method of claim 1 further comprising mounting a cap on the substrate.

3. The method of claim 1 wherein the substrate comprises a flexible substrate.

4. The method of claim 3 further comprising forming electrodes on the substrate, wherein the pillars extend in a first direction, the electrodes extend in a second direction, and the first direction is different from the second direction.

5. The method of claim 4 further comprising mounting a cap on the substrate to hermetically seal the OLED device.

6. The method of claim 3 wherein the functional organic material comprises a conjugated polymer.

7. The method of claim 6 further comprising mounting a cap on the substrate to hermetically seal the OLED device.

8. The method of claim 3 further comprising mounting a cap on the substrate to hermetically seal the OLED device.

9. The method of claim 1 further comprising forming electrodes on the substrate, wherein the pillars extend in a first direction, the electrodes extend in a second direction, and the first direction is different from the second direction.

10. The method of claim 9 wherein the functional organic material comprises a conjugated polymer.

11. The method of claim 10 further comprising mounting a cap on the substrate to hermetically seal the OLED device.

12. The method as recited in claim 1, wherein the device layer comprises a photosensitive layer and the method further comprises patterning the photosensitive layer by exposing and developing the photosensitive layer.

13. The method as recited in claim 12 wherein the photosensitive layer comprises a positive photosensitive material, wherein exposed portions of the photosensitive layer are removed during developing.

14. The method as recited in claim 13 wherein the exposing comprises successively exposing the photosensitive layer with electrons or charged particles having different energies which have different penetration depths to form pillars with the tapered profile during developing.

15. The method as recited in claim 14 further comprising curing the pillars to render the pillars inert against the solvent.

16. The method as recited in claim 15 wherein the curing comprises thermal curing.

17. The method as recited in claim 15 wherein the curing comprises UV curing.

18. The method as recited in claim 15 wherein the curing comprises electron beam curing.

19. The method as recited in claim 15 wherein the curing comprises particle curing.

20. The method as recited in claim 13 wherein the exposing comprises exposing upper regions of the photosensitive layer with a lesser amount of energy than lower regions of the photosensitive layer to form the tapered profile during developing.

21. The method as recited in claim 20 further comprising curing the pillars to render the pillars inert against the solvent.

22. The method as recited in claim 21 wherein the curing comprises thermal curing.

23. The method as recited in claim 21 wherein the curing comprises UV curing.

24. The method as recited in claim 21 wherein the curing comprises electron beam curing.

25. The method as recited in claim 21 wherein the curing comprises particle curing.

26. The method as recited in claim 13 further comprising curing the pillars to render the pillars inert against the solvent.

27. The method as recited in claim 26 wherein the curing comprises thermal curing.

28. The method as recited in claim 26 wherein the curing comprises UV curing.

29. The method as recited in claim 26 wherein the curing comprises electron beam curing.

30. The method as recited in claim 26 wherein the curing comprises particle curing.

31. The method as recited in claim 12 wherein the exposing comprises successively exposing the photosensitive layer with electrons or charged particles having different energies which have different penetration depths to form pillars with the tapered profile during developing.

32. The method as recited in claim 31 further comprising curing the pillars to render the pillars inert against the solvent.

33. The method as recited in claim 32 wherein the curing comprises thermal curing.

34. The method as recited in claim 32 wherein the curing comprises UV curing.

35. The method as recited in claim 32 wherein the curing comprises electron beam curing.

36. The method as recited in claim 32 wherein the curing comprises particle curing.

37. The method as recited in claim 12 further comprising curing the pillars to render the pillars inert against the solvent.

38. The method as recited in claim 37 wherein the curing comprises thermal curing.

39. The method as recited in claim 37 wherein the curing comprises UV curing.

40. The method as recited in claim 37 wherein the curing comprises electron beam curing.

41. The method as recited in claim 37 wherein the curing comprises particle curing.

42. The method as recited in claim 12 wherein the photosensitive layer comprises a negative photosensitive material, wherein unexposed portions of the photosensitive layer are removed during developing.

43. The method as recited in claim 42 wherein the exposing comprises successively exposing the photosensitive layer with electrons or charged particles having different energies which have different penetration depths to form pillars with the tapered profile during developing.

44. The method as recited in claim 43 further comprising curing the pillars to render the pillars inert against the solvent.

45. The method as recited in claim 44 wherein the curing comprises thermal curing.

46. The method as recited in claim 44 wherein the curing comprises UV curing.

47. The method as recited in claim 44 wherein the curing comprises electron beam curing.

48. The method as recited in claim 44 wherein the curing comprises particle curing.

49. The method as recited in claim 42 wherein the exposing comprises exposing upper regions of the photosensitive layer with a greater amount of energy than lower regions of the photosensitive layer to form the tapered profile during developing.

50. The method as recited in claim 49 further comprising curing the pillars to render the pillars inert against the solvent.

51. The method as recited in claim 50 wherein the curing comprises thermal curing.

52. The method as recited in claim 50 wherein the curing comprises UV curing.

53. The method as recited in claim 50 wherein the curing comprises electron beam curing.

54. The method as recited in claim 50 wherein the curing comprises particle curing.

55. The method as recited in claim 42 further comprising curing the pillars to render the pillars inert against the solvent.

56. The method as recited in claim 55 wherein the curing comprises thermal curing.

57. The method as recited in claim 55 wherein the curing comprises UV curing.

58. The method as recited in claim 55 wherein the curing comprises electron beam curing.

59. The method as recited in claim 55 wherein the curing comprises particle curing.

60. An OLED device comprising:
pillars on a substrate oriented in a first direction, wherein the pillars have a tapered profile;
an organic functional material on the substrate, between the pillars, wherein the organic functional material is deposited on the substrate in a solvent and the pillars are inert to the solvent; and
a conductive layer on the substrate, wherein the tapered profile of the pillars separates the conductive layer into a first portion, between the pillars, and a second portion, on the pillars.

61. The OLED device of claim 60, further comprising a cap mounted on the substrate.

62. The OLED device of claim 60, wherein the substrate comprises a flexible substrate.

63. The OLED device of claim 62, wherein the substrate comprises electrodes oriented in a second direction.

64. The OLED device of claim 63, further comprising a cap mounted on the substrate.

65. The OLED device of claim 62 wherein the functional organic material comprises a conjugated polymer.

66. The OLED device of claim 65 further comprising a cap mounted on the substrate.

67. The OLED device of claim 62 further comprising a cap mounted on the substrate.

68. The OLED device of claim 60 wherein the substrate comprises electrodes oriented in a second direction.

69. The OLED device of claim 68 wherein the functional organic material comprises a conjugated polymer.

70. The OLED device of claim 69 further comprising a cap mounted on the substrate.

71. The OLED device of claim 60 wherein the pillars are cured.

72. The OLED device of claim 60, wherein the solvent is one of NMP or xylene.

* * * * *

UNITED STATES PATENT AND TRADEMARK OFFICE
CERTIFICATE OF CORRECTION

| | | |
|---|---|---|
| PATENT NO. | : 7,057,337 B1 | Page 1 of 1 |
| APPLICATION NO. | : 10/363200 | |
| DATED | : June 6, 2006 | |
| INVENTOR(S) | : Ewald Karl Michael Guenther | |

It is certified that error appears in the above-identified patent and that said Letters Patent is hereby corrected as shown below:

Column 5, Line 49 at Claim 1; replace:

"fanning a device layer on a substrate" with
--forming a device layer on a substrate--

Signed and Sealed this

Fifth Day of June, 2007

JON W. DUDAS
*Director of the United States Patent and Trademark Office*